(12) United States Patent
Edwards et al.

(10) Patent No.: US 8,716,821 B2
(45) Date of Patent: May 6, 2014

(54) LOW-CAPACITANCE PHOTODIODE UTILIZING VERTICAL CARRIER CONFINEMENT

(71) Applicant: Texas Instruments Incorporated, Dallas, TX (US)

(72) Inventors: Henry Litzmann Edwards, Garland, TX (US); Dimitar Trifonov Trifonov, Vail, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/767,978

(22) Filed: Feb. 15, 2013

(65) Prior Publication Data

US 2013/0207210 A1  Aug. 15, 2013

Related U.S. Application Data

(60) Provisional application No. 61/599,277, filed on Feb. 15, 2012.

(51) Int. Cl.
*H01L 27/14* (2006.01)

(52) U.S. Cl.
USPC ............ 257/431; 257/347; 257/461; 438/27; 438/48; 438/57; 438/73

(58) Field of Classification Search
None
See application file for complete search history.

(56) References Cited

U.S. PATENT DOCUMENTS

2010/0323468 A1\* 12/2010 Hannebauer .................... 438/57

\* cited by examiner

*Primary Examiner* — Kyoung Lee
(74) *Attorney, Agent, or Firm* — Jacqueline J. Garner; Wade J. Brady, III; Frederick J. Telecky, Jr.

(57) ABSTRACT

A semiconductor device contains a photodiode which includes a buried collection region formed by a bandgap well to vertically confine photo-generated minority carriers. the bandgap well has the same conductivity as the semiconductor material immediately above and below the bandgap well. A net average doping density in the bandgap well is at least a factor of ten less than net average doping densities immediately above and below the bandgap well. A node of the photodiode, either the anode or the cathode, is connected to the buried collection region to collect the minority carriers, the polarity of the node matches the polarity of the minority carriers. The photodiode node connected to the buried collection region occupies less lateral area than the lateral area of the buried collection region.

20 Claims, 18 Drawing Sheets

LOW-CAPACITANCE PHOTODIODE UTILIZING VERTICAL CARRIER CONFINEMENT

CROSS-REFERENCE TO RELATED APPLICATIONS

This application claims the benefit of priority under U.S.C. §119(e) of U.S. Provisional Application 61/599,277 filed Feb. 15, 2012.

FIELD OF THE INVENTION

This invention relates to the field of semiconductor devices. More particularly, this invention relates to photodetectors in semiconductor devices.

BACKGROUND OF THE INVENTION

Photodiodes in semiconductor devices which are designed to detect near infrared light, with wavelengths of 750 nanometers to 1000 nanometers, commonly involve a tradeoff between junction capacitance and collection efficiency. Efficient collection requires a junction which covers most of the collection area, generating undesired junction capacitance which disadvantageously limits a maximum detected signal frequency. Reducing the junction area undesirably reduces collection efficiency, as photo-generated minority carriers may recombine before being collected.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device contains a photodiode which includes a buried collection region formed by a bandgap well to vertically confine photo-generated minority carriers. A node of the photodiode, either the anode or the cathode, is connected to the buried collection region to collect the minority carriers, the polarity of the node matches the polarity of the minority carriers. The photodiode node connected to the buried collection region occupies less lateral area than the lateral area of the buried collection region, forming a low capacitance photodiode with improved collection efficiency.

DETAILED DESCRIPTION OF EXAMPLE EMBODIMENTS

The following applications contains related materials and are hereby incorporated in their entirety: application Ser. No. 13/768,024 entitled "WAVELENGTH SENSITIVE PHOTODIODE EMPLOYING SHORTED JUNCTION" and application Ser. No. 13/768,037 entitled "PHOTODIODE EMPLOYING SURFACE GRATING TO ENHANCE SENSITIVITY" filed concurrently with this application.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device contains a photodiode which includes a buried collection region formed by a bandgap well to vertically confine photo-generated minority carriers. A node of the photodiode, either an anode or a cathode, is connected to the buried collection region to collect the minority carriers. The anode or cathode connected to the buried collection region occupies less lateral area than the lateral area of the buried collection region. The lateral area of the anode or cathode is the area of the anode or cathode projected on a top surface of a substrate of the semiconductor device, and similarly for the lateral area of the buried collection region. A photodiode which generates electron minority carriers has a conduction band well in a p-type region, and a cathode of the photodiode is connected to the conduction band well to collect the electrons. Analogously, a photodiode which generates hole minority carriers has a valence band well in an n-type region, and an anode of the photodiode is connected to the valence band well to collect the holes. The bandgap well may be formed by any of several methods, including epitaxial growth and ion implantation. The bandgap well may possibly extend laterally past the photodiode. A guard ring may be formed around the photodiode to limit collection of unwanted minority carriers. The examples described herein disclose photodiodes which generate electron minority carriers; it will be recognized that photodiodes which generate hole minority carriers may be formed with appropriate changes in polarities of relevant semiconductor regions.

Figure 1:
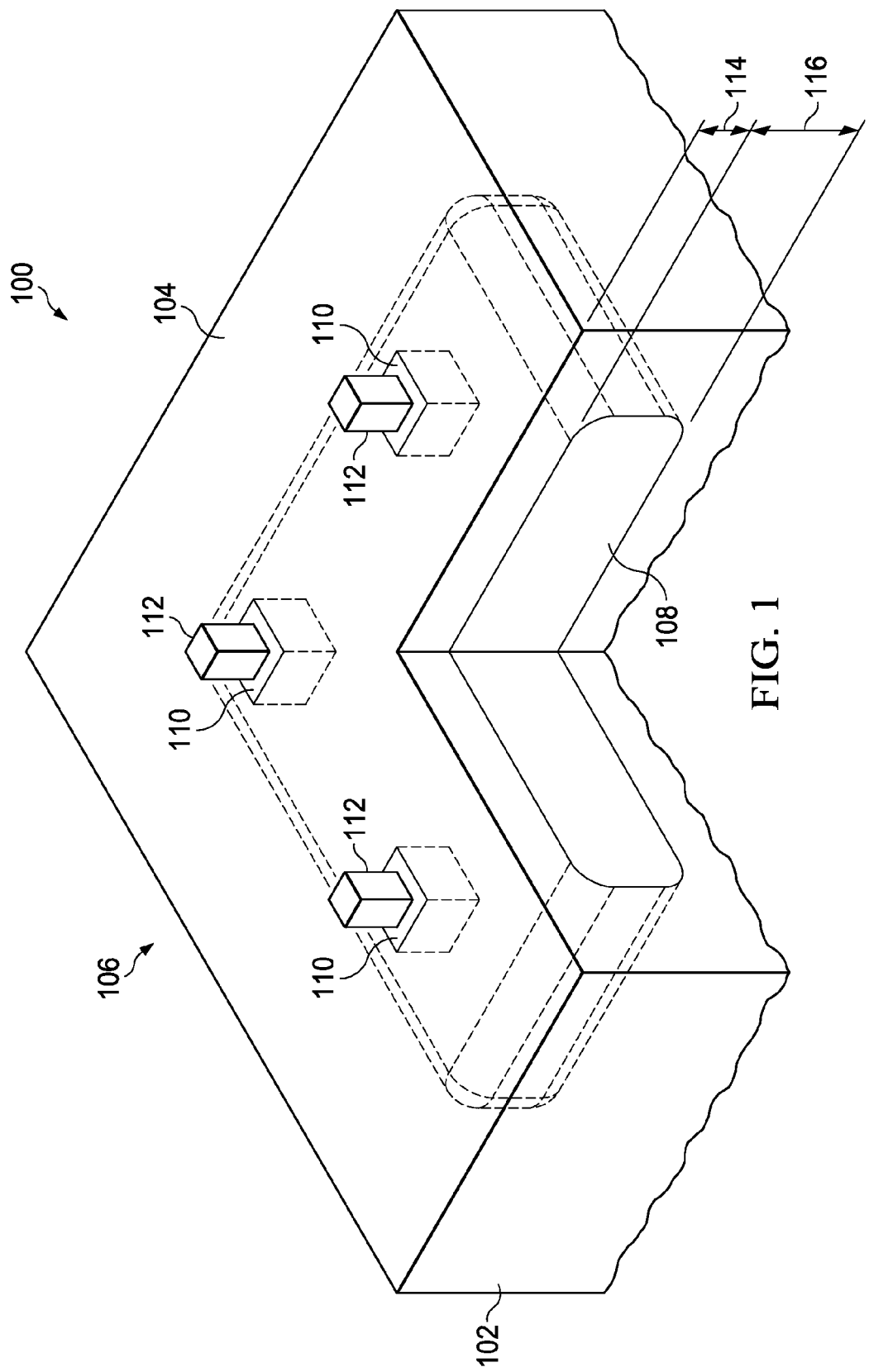
FIG. 1 is a cross section of an exemplary semiconductor device containing a photodiode with a buried collection region.

FIG. 1 is a cross section of an exemplary semiconductor device containing a photodiode with a buried collection region. The semiconductor device 100 is formed in and on a substrate 102 containing a p-type semiconductor material extending to a top surface 104 of the substrate 102. The photodiode 106 includes a buried collection region 108 formed by a conduction band well, described in reference to FIG. 2, disposed in the substrate 102 below the top surface 104. The photodiode 106 further includes an n-type cathode 110 which is electrically connected to the buried collection region 108. The cathode 110 may include more than one n-type region as depicted in FIG. 1. The cathode 110 may be configured, for example, as an array of separate regions with lateral dimensions significantly less than lateral dimensions of the photodiode 106. Alternatively, the cathode 110 may be configured as a frame at a boundary of the photodiode 106 to improve a collection efficiency of the photodiode 106. A lateral area of the cathode 110 is less than a lateral area of the buried photodiode 106. In one version of the instant example, the lateral area of the cathode 110 may be less than half the lateral area of the buried collection region 108. One or more cathode terminals 112 are electrically coupled to the cathode 110.

During operation of the semiconductor device 100, incident light on the semiconductor device 100 generates electron-hole pairs, referred to as photo-generated electrons and photo-generated holes. Photo-generated electrons of the hole-electron pairs are minority carriers in the p-type substrate 102. Electrons which are generated in the buried collection region 108 are vertically confined by the conduction band well so as to prevent recombination at the top surface 104 of the substrate or diffusion into the substrate 102 below the buried collection region 108. Electrons which are generated near the buried collection region 108 may diffuse into the conduction band well and be vertically confined. Electrons in the buried collection region 108 diffuse to the cathode 110 and are collected by a detection circuit, not shown. Vertical confinement thus allows a smaller area of the cathode 110 for a desired collection efficiency.

A depth 114 and thickness 116 of the buried collection region 108 may be selected to provide collection of photo-generated minority carriers in a preferred wavelength band. In one version of the instant example, the buried collection region 108 may have a depth 114 of 2 to 5 microns and a thickness 116 of 2 to 30 microns, so as to provide collection of photo-generated minority carriers in a wavelength band of 750 nanometers to 1000 nanometers.

Confining the electrons in the buried collection region 108 for subsequent collection by the cathode 110 may advantageously provides a higher collection efficiency compared to a photodiode without a buried collection region. Forming the cathode 110 to occupy less lateral area than the buried collection region 108 may advantageously provide a lower junction capacitance, and hence enable a higher operating frequency, compared to a photodiode with a larger area cathode.

Figure 2:
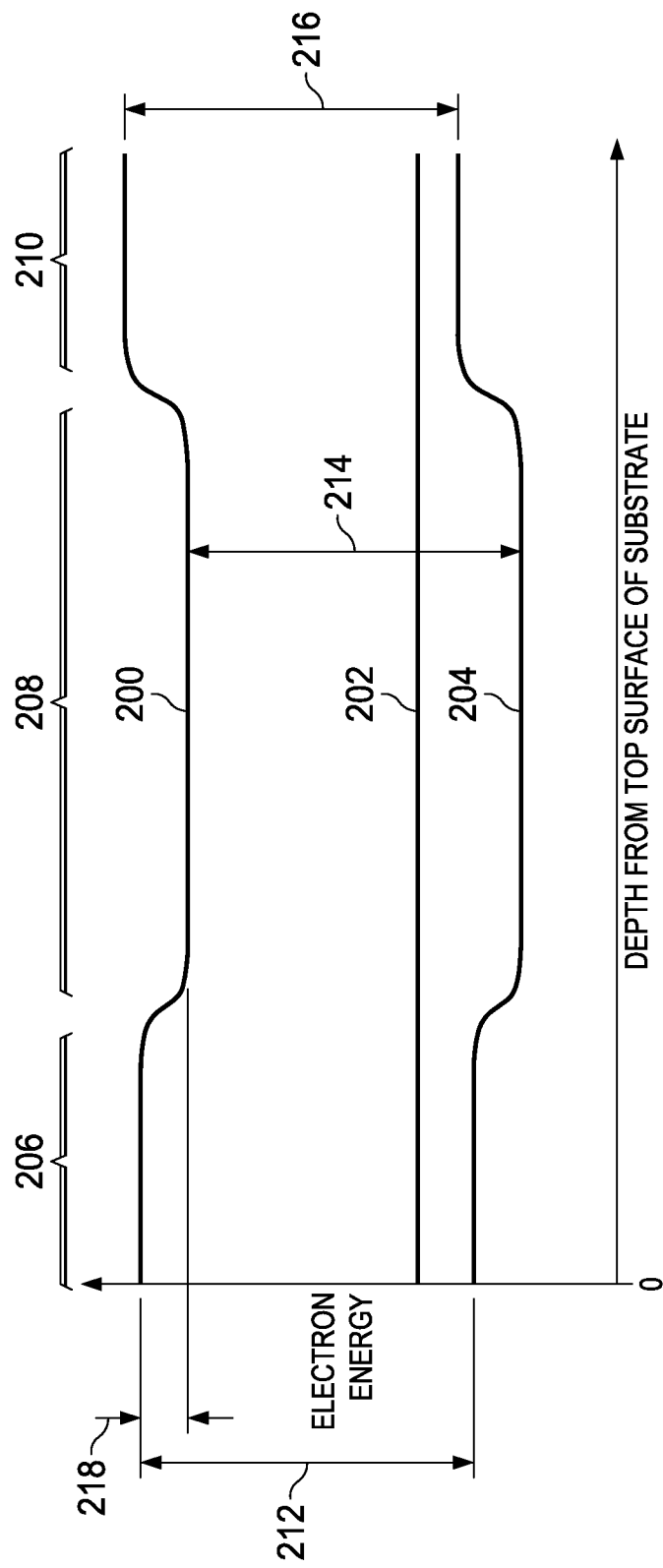
FIG. 2 is an energy band diagram of the substrate of the semiconductor device of FIG. 1, including the buried collection region.

FIG. 2 is an energy band diagram of the substrate 102 of the semiconductor device 100 of FIG. 1, including the buried collection region 108. The energy band diagram depicts a conduction band 200, a Fermi energy level 202 and a valence band 204, spanning a surface region 206 which extends from the top surface 104 of the substrate 102 to the buried collection region 108, the bandgap well 208 which forms the buried collection region 108, and a lower region 210 which extends below the buried collection region 108.

A bandgap energy 212 of the surface region 206, a bandgap energy 214 of the bandgap well 208, and a bandgap energy 216 of the lower region 210 are all above 0.8 electron volts. The surface region 206, the bandgap well 208 and the lower region 210 are all a same conductivity type; in the instant example, p-type. A well energy 218 of the bandgap well 208 is an energy difference between the conduction band 200 in the surface region 206 and the conduction band 200 in the bandgap well 208, or an energy difference between the conduction band 200 in the lower region 210 and the conduction band 200 in the bandgap well 208, whichever is smaller. A net average doping density of the bandgap well 208 is at least a factor of ten less than a net average doping density of the surface region 206 abutting the bandgap well 208 and of the lower region 210 within 100 microns of a bottom of the bandgap well 208, so that the well energy 218 of the bandgap well 208 is at least 50 milli-electron volts at room temperature, that is 20° C. to 22° C. The term net average doping density is understood to mean an average of p-type dopants subtracted from an average of n-type dopants. It will be recognized that photodiodes which generate hole minority carriers may be described by an energy band diagram similar to FIG. 2, with a valence band well instead of a conduction band well.

Figure 3A:
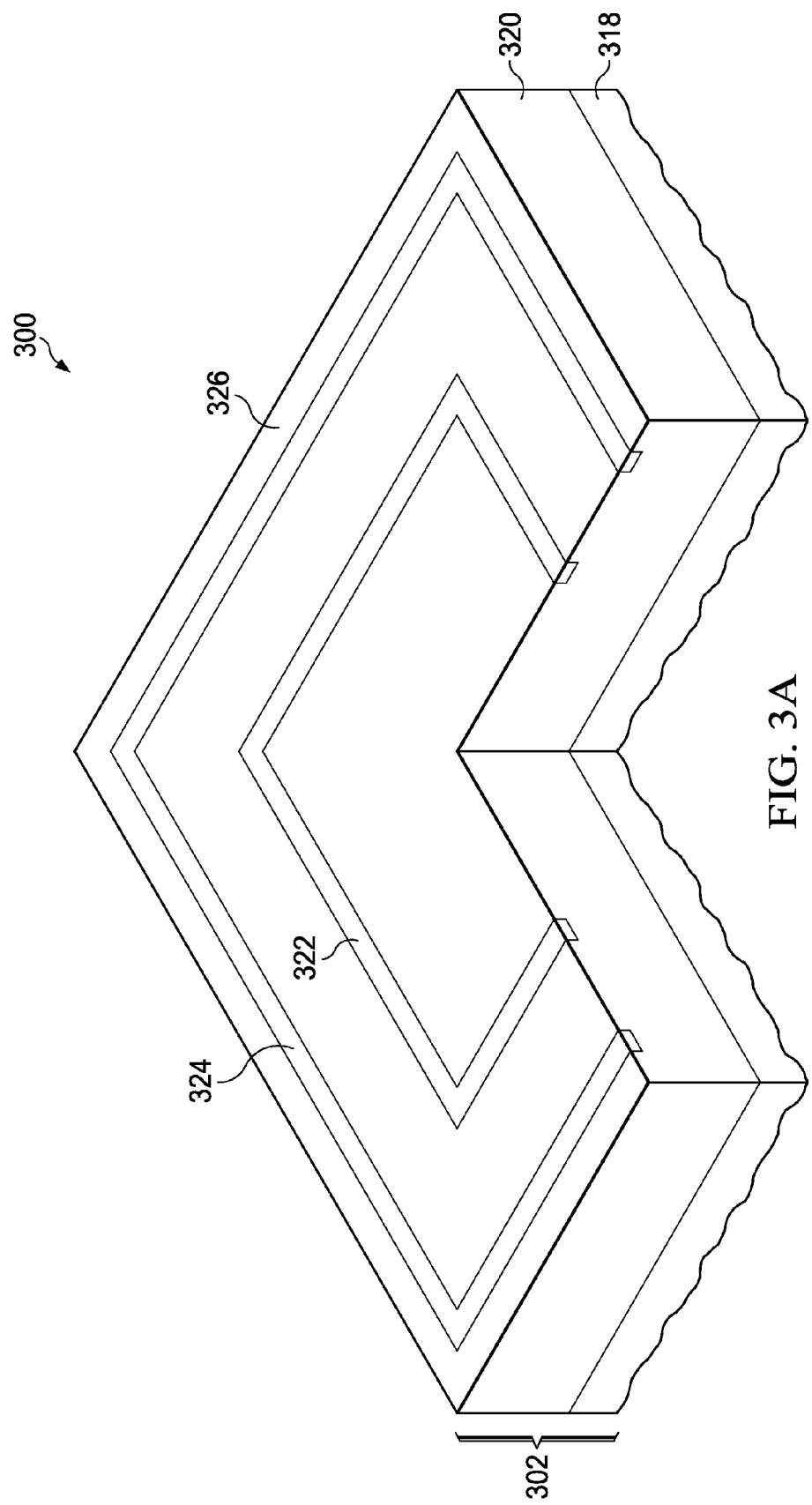
FIG. 3A through FIG. 3E are cross sections of a semiconductor device containing a photodiode with a buried collection region, depicted in successive stages of fabrication.

FIG. 3A through FIG. 3E are cross sections of a semiconductor device containing a photodiode with a buried collection region, depicted in successive stages of fabrication. Referring to FIG. 3A, the semiconductor device 300 is formed in and on a substrate 302 which includes a p-type starting wafer 318 and a p-type lower epitaxial layer 320 formed on the starting wafer 318. A net average doping density of the starting wafer 318 within 100 microns of the lower epitaxial layer 320 is at least a factor of ten higher than a net average doping density of the lower epitaxial layer 320. The lower epitaxial layer 320 may be, for example, 2 microns to 30 microns thick.

A buried cathode implanted region 322 containing n-type dopants is formed at a top surface 326 of the lower epitaxial layer 320. The buried cathode implanted region 322 may have a closed loop configuration as depicted in FIG. 3A, to provide a desired collection efficiency of the photodiode 306. Alternatively, the buried cathode implanted region 322 may have another configuration, for example, an array plurality of lines, or a two-dimensional array of separate regions with lateral dimensions significantly less than lateral dimensions of the photodiode 306 so as to reduce a capacitance of a subsequently formed cathode of the photodiode 306. The buried cathode implanted region 322 may be formed, for example, by implanting the n-type dopants, for example antimony, arsenic and possibly phosphorus, at a dose of $5 \times 10^{14}$ cm$^{-2}$ to $5 \times 10^{14}$ cm$^{-2}$, using an implant mask of photoresist or silicon dioxide. Optionally, a guard ring implanted region 324 may be formed around the buried cathode implanted region 322, concurrently with the buried cathode implanted region 322. A subsequent thermal drive may heat the substrate 302 to diffuse the implanted n-type dopants and form a layer of thermal oxide at the top surface 326 of the lower epitaxial layer 320. The thermal drive may include heating the substrate 302 at 1200° C. for 80 minutes or equivalent conditions, for example, 1225° C. for 50 minutes, or 1175° C. for 130 minutes. The thermal oxide may be 20 to 50 nanometers thick.

Figure 3B:
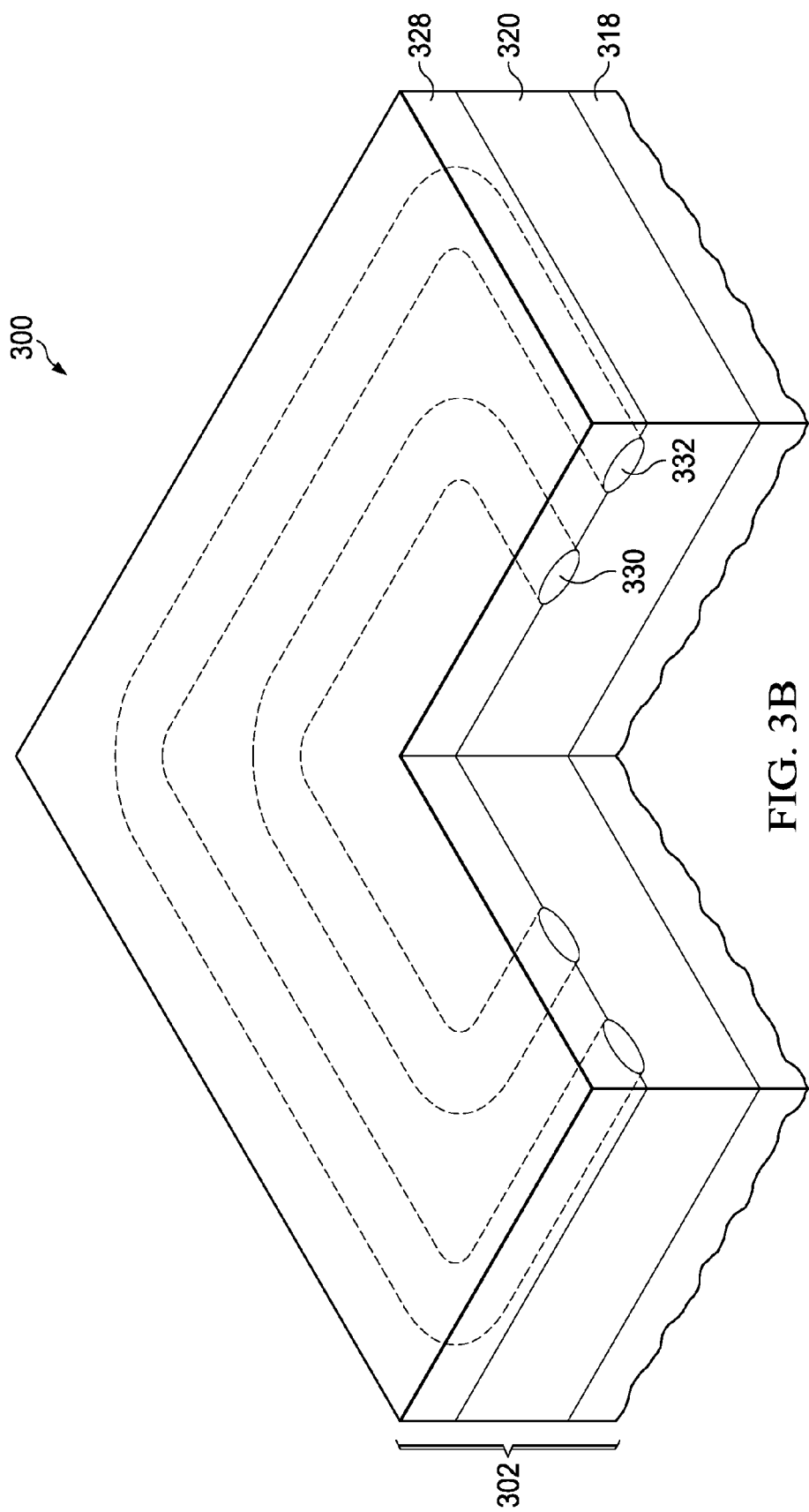

Referring to FIG. 3B, an upper epitaxial layer 328 is formed over the lower epitaxial layer 320; the substrate 302 then includes the upper epitaxial layer 328. The process of forming the upper epitaxial layer 328 causes the n-type dopants in the buried cathode implanted region 322 of FIG. 3A to diffuse and become activated so as to form a buried cathode 330. In the instant example, the buried cathode 330 extends into the lower epitaxial layer 320 and the upper epitaxial layer 328. The process of forming the upper epitaxial layer 328 also causes the n-type dopants in the guard ring implanted region 324 of FIG. 3A, if present, to diffuse and become activated so as to form a guard ring 332 around the buried cathode 330. A net average doping density of the upper epitaxial layer 328 is at least a factor of ten higher than a net average doping density of the lower epitaxial layer 320. The upper epitaxial layer 328 may be, for example, 2 microns to 5 microns thick.

Figure 3C:
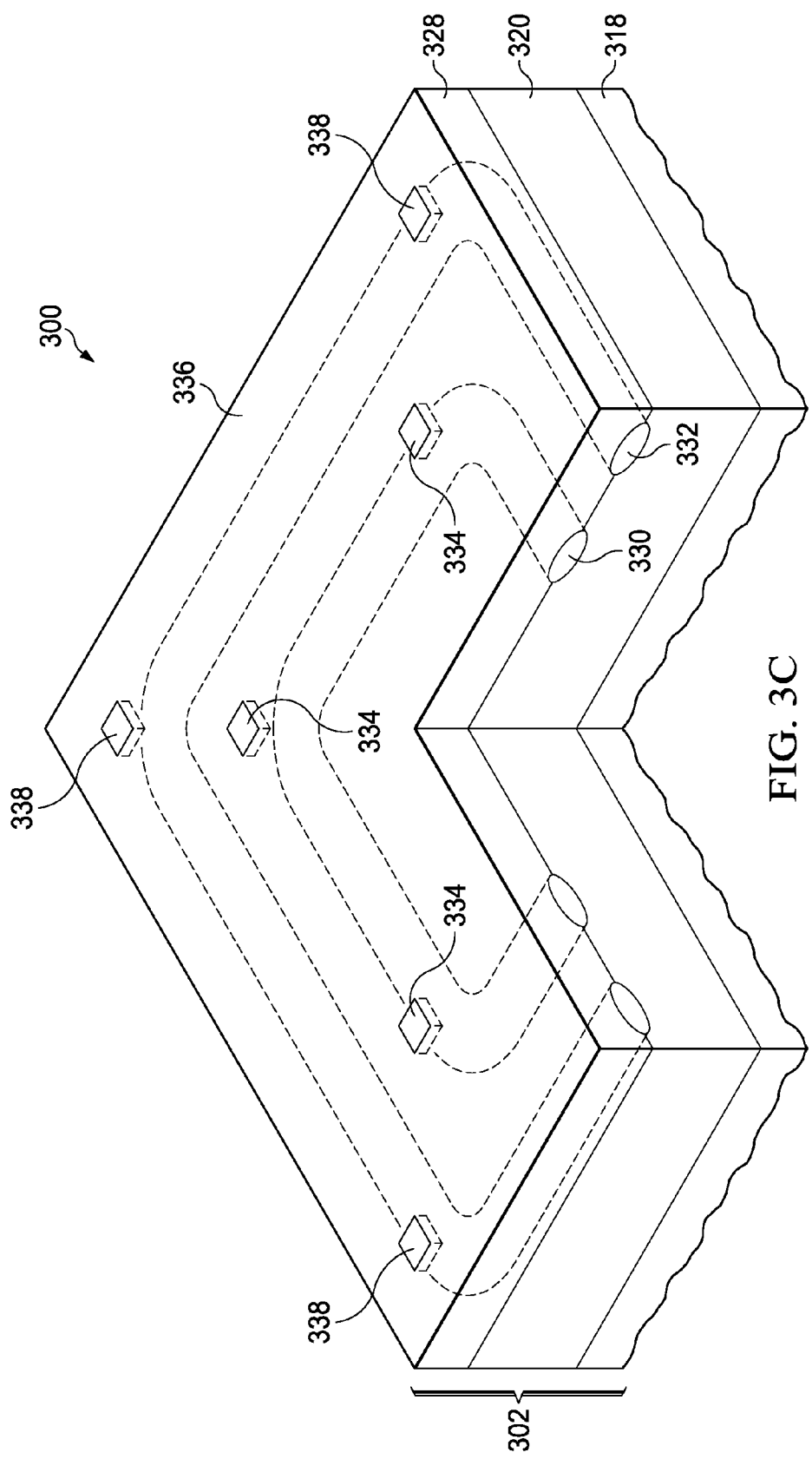

Referring to FIG. 3C, cathode connector implanted regions 334 are formed at a top surface 336 of the upper epitaxial layer 328 over the buried cathode 330 by implanting n-type dopants such as phosphorus at a dose of $3 \times 10^{15}$ cm$^{-2}$ to $2 \times 10^{16}$ cm$^{-2}$. The cathode connector implanted regions 334 may be formed for example using an implant mask of photoresist. In versions of the instant example in which the guard ring 332 is present, guard ring connector implanted regions 338 may optionally be formed over the guard ring 332 concurrently with the cathode connector implanted regions 334.

Figure 3D:
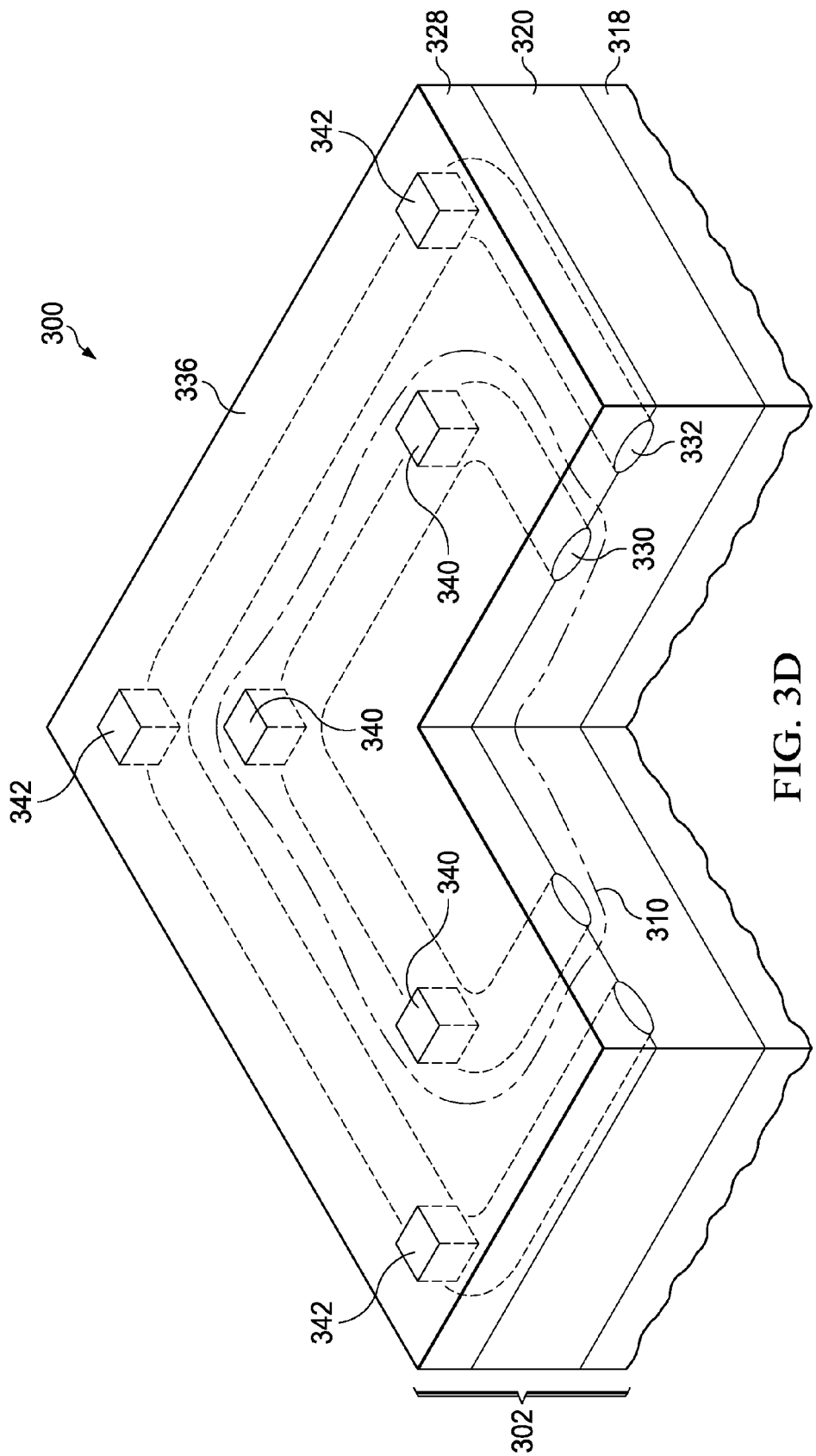

Referring to FIG. 3D, an anneal operation causes the n-type dopants in the cathode connector implanted regions 334 of FIG. 3C to diffuse and become activated to form n-type cathode connector regions 340 which contact and make electrical connection to the buried cathode 330 and extend to the top surface 336 of the upper epitaxial layer 328. The anneal may include heating the substrate 302 at 900° C. for 20 minutes or equivalent conditions, for example, 925° C. for 10 minutes, or 875° C. for 45 minutes. The buried cathode 330 and the cathode connector regions 340 combine to provide a cathode 310 of the photodiode 306.

If the guard ring connector implanted regions 338 are present, the anneal operation causes the n-type dopants in the guard ring connector implanted regions 338 to diffuse and become activated to form n-type guard ring connector regions 342 which contact and make electrical connection to the guard ring 332 and extend to the top surface 336 of the upper epitaxial layer 328.

Figure 3E:
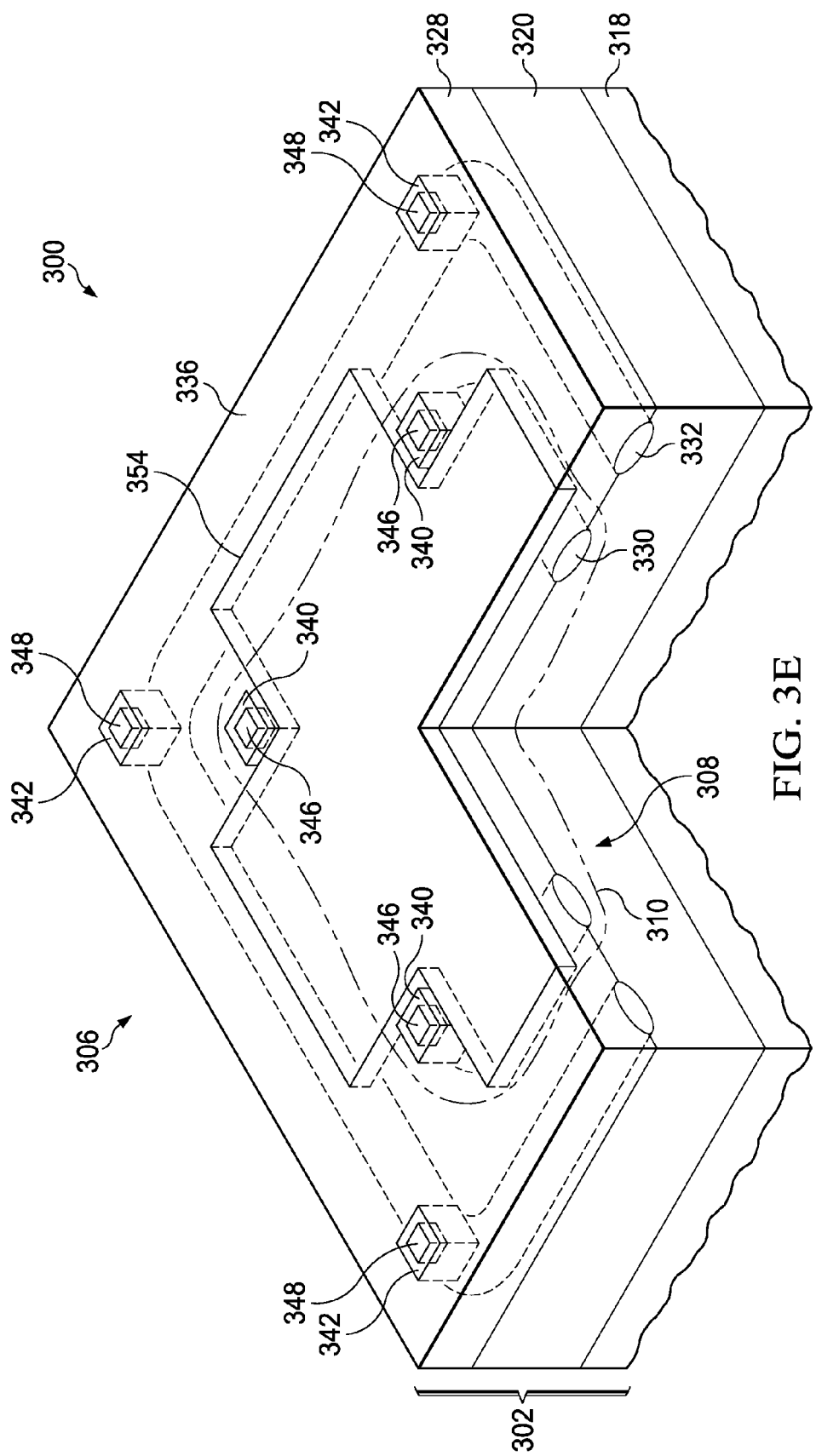

Referring to FIG. 3E, n-type cathode contact regions 346 are formed at the top surface of the upper epitaxial layer 328 so as to make electrical connection to the cathode connection regions 340. The cathode contact regions 346 may be formed, for example, by implanting n-type dopants such as phosphorus and arsenic at a total dose of $5 \times 10^{14}$ cm$^{-2}$ to $5 \times 10^{15}$ cm$^{-2}$ and an energy of 30 to 100 keV, followed by an anneal of 1000° C. for 15 seconds in a rapid thermal processor (RTP). In versions of the instant example in which the guard ring 332 is present, n-type guard ring contact regions 348 may be formed concurrently with the cathode contact regions 346 so as to make electrical connection to the guard ring connector regions 342. Cathode terminals are subsequently formed on the cathode contact regions 346 to provide electrical connection to a detection circuit.

The lower epitaxial layer 320 proximate to the buried cathode 330 provides a buried collection region 308 of the photodiode 306. The guard ring 332 may advantageously limit collection of minority carriers outside the photodiode 306.

Optionally, an n-type short wavelength screening region 354 may be formed over the buried collection region 308 concurrently with the cathode contact regions 346. Electrically shorting the short wavelength screening region 354 to the upper epitaxial layer 328 may inhibit minority carriers generated by shorter wavelength light, for example less than 700 nanometers, from being collected in the buried collection region 308. The shorter wavelength light is absorbed at shallow depths in the upper epitaxial layer 328 and hence minority carriers generated by the shorter wavelength light may diffuse into the short wavelength screening region 354 and recombine rather than diffuse into the buried collection region 308 and be collected by the buried cathode 330.

Forming the photodiode 306 with the lower epitaxial layer 320, the buried cathode 330 and the upper epitaxial layer 328 may advantageously facilitate integration of the photodiode 306 with analog components using n-type buried layers under epitaxial layers. Forming the cathode 310 to occupy less lateral area than the photodiode 306 may advantageously provide a lower junction capacitance, and hence enable a higher operating frequency, compared to a photodiode with a larger area cathode.

Figure 4A:
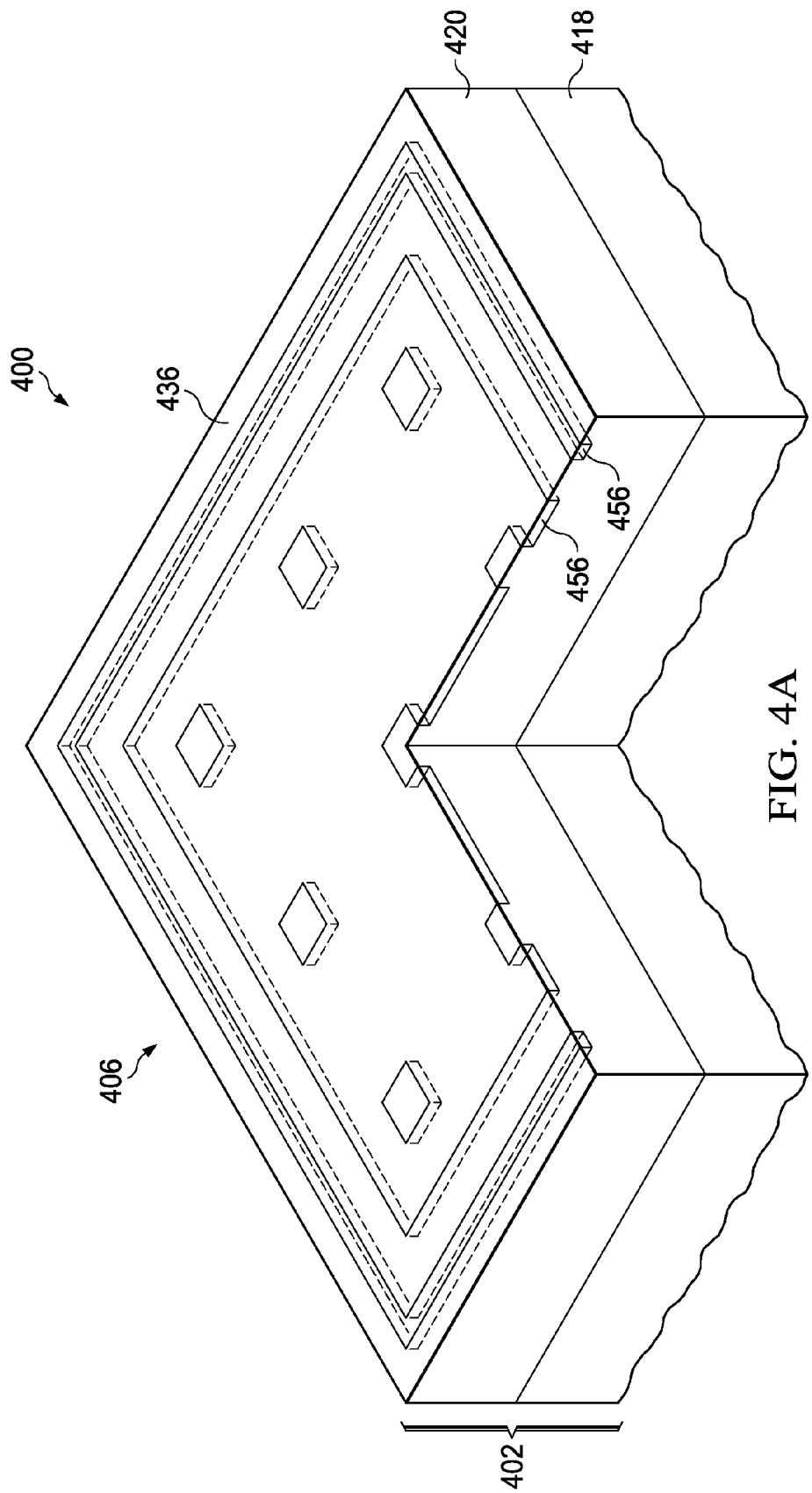
FIG. 4A through FIG. 4D are cross sections of another semiconductor device containing a photodiode with a buried collection region, depicted in successive stages of fabrication.

FIG. 4A through FIG. 4D are cross sections of another semiconductor device containing a photodiode with a buried collection region, depicted in successive stages of fabrication. Referring to FIG. 4A, the semiconductor device 400 is formed in and on a substrate 402 which includes a p-type starting wafer 418 and a p-type epitaxial layer 420 formed on the starting wafer 418. A net average doping density of the starting wafer 418 within 100 microns of the epitaxial layer 420 is at least a factor of ten higher than a net average doping density of the epitaxial layer 420. The epitaxial layer 420 may be, for example, 4 microns to 35 microns thick.

An upper region implanted layer 456 containing p-type dopants is formed at a top surface 436 of the epitaxial layer 420 over an area for the photodiode 406. The upper region implanted layer 456 may be formed for example by using an implant mask of photoresist and implanting p-type dopants such as boron at a dose of $3 \times 10^{12}$ cm$^{-2}$ to $5 \times 10^{13}$ cm$^{-2}$. The upper region implanted layer 456 may have cutout areas for a subsequently formed cathode, as depicted in FIG. 4A.

Figure 4B:
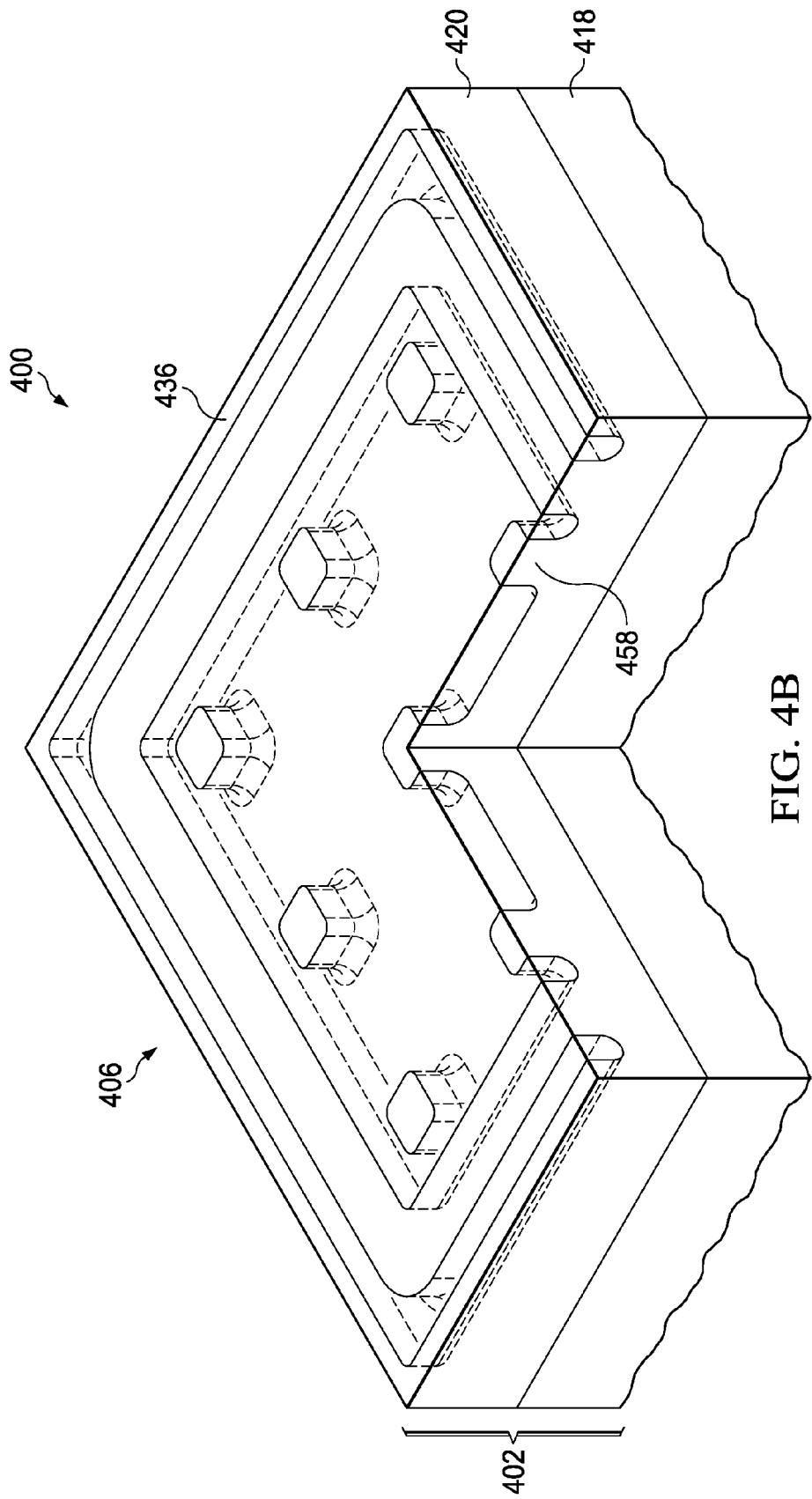

Referring to FIG. 4B, a thermal drive operation heats the substrate 402 causing the p-type dopants in the upper region implanted layer 456 of FIG. 4A to diffuse and become activated to form a p-type upper region 458 in the area for the photodiode 406. A net average doping density of the upper region 458 is at least a factor of ten higher than a net average doping density of the epitaxial layer 420 below the upper region 458.

Figure 4C:
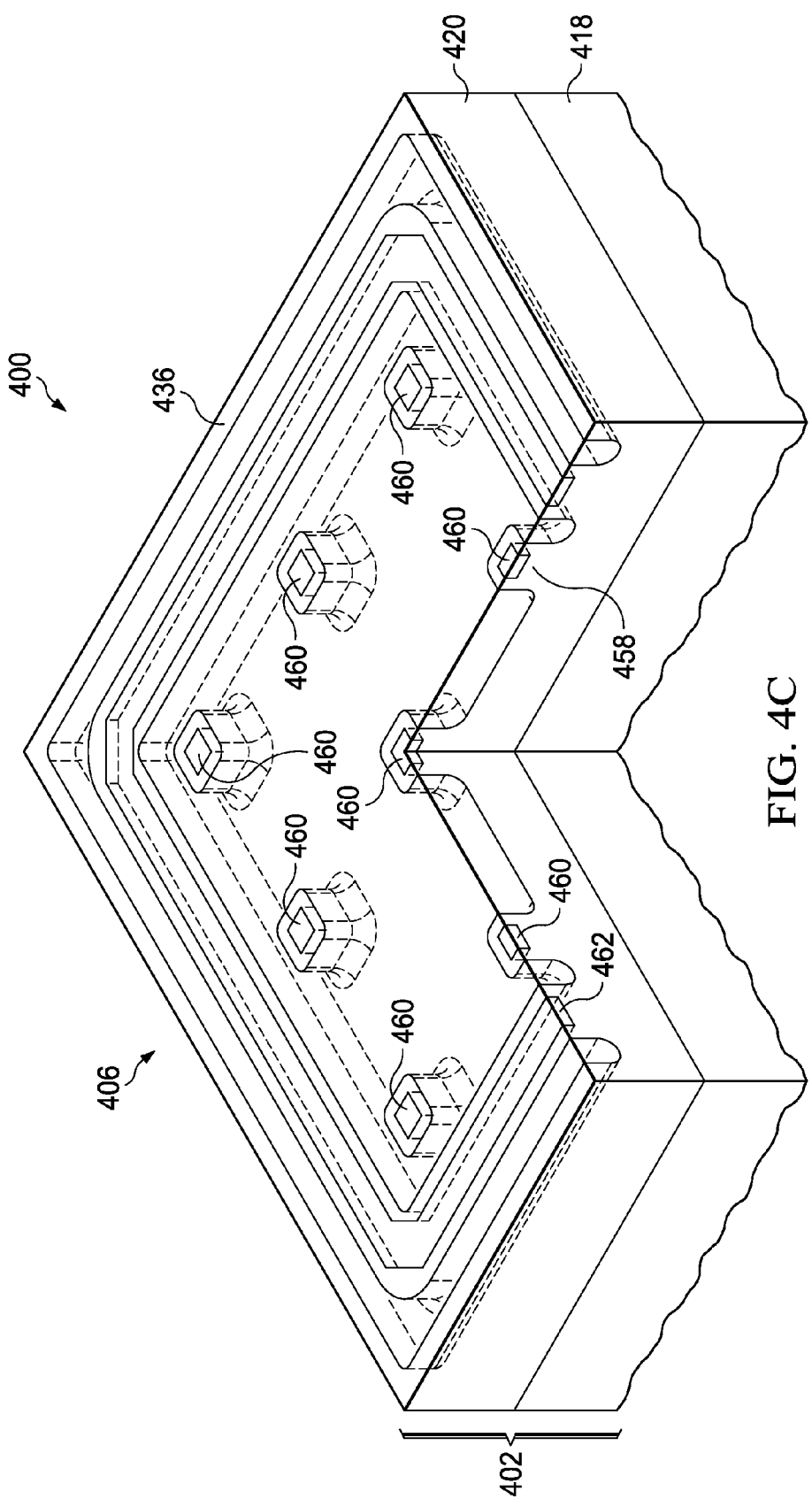

Referring to FIG. 4C, cathode implanted regions 460 containing n-type dopants are formed in the upper region 458 at the top surface 436 of the epitaxial layer 420. The cathode implanted regions 460 may be formed for example by implanting n-type dopants such as phosphorus using an implant mask of photoresist at a dose of $3 \times 10^{15}$ cm$^{-2}$ to $2 \times 10^{16}$ cm$^{-2}$. In one version of the instant example, the cathode implanted regions 460 may have lateral dimensions less than 2 microns and be separated by more than 10 microns, so as to reduce a capacitance of a subsequently formed cathode of the photodiode 406. In other versions, the cathode implanted regions 460 may be configured as an array of lines or a frame at a boundary of the photodiode 406 to improve a collection efficiency of the photodiode 406. Optionally, a guard ring implanted region 462 may be formed around the area for the photodiode 406 concurrently with the cathode implanted regions 460.

Figure 4D:
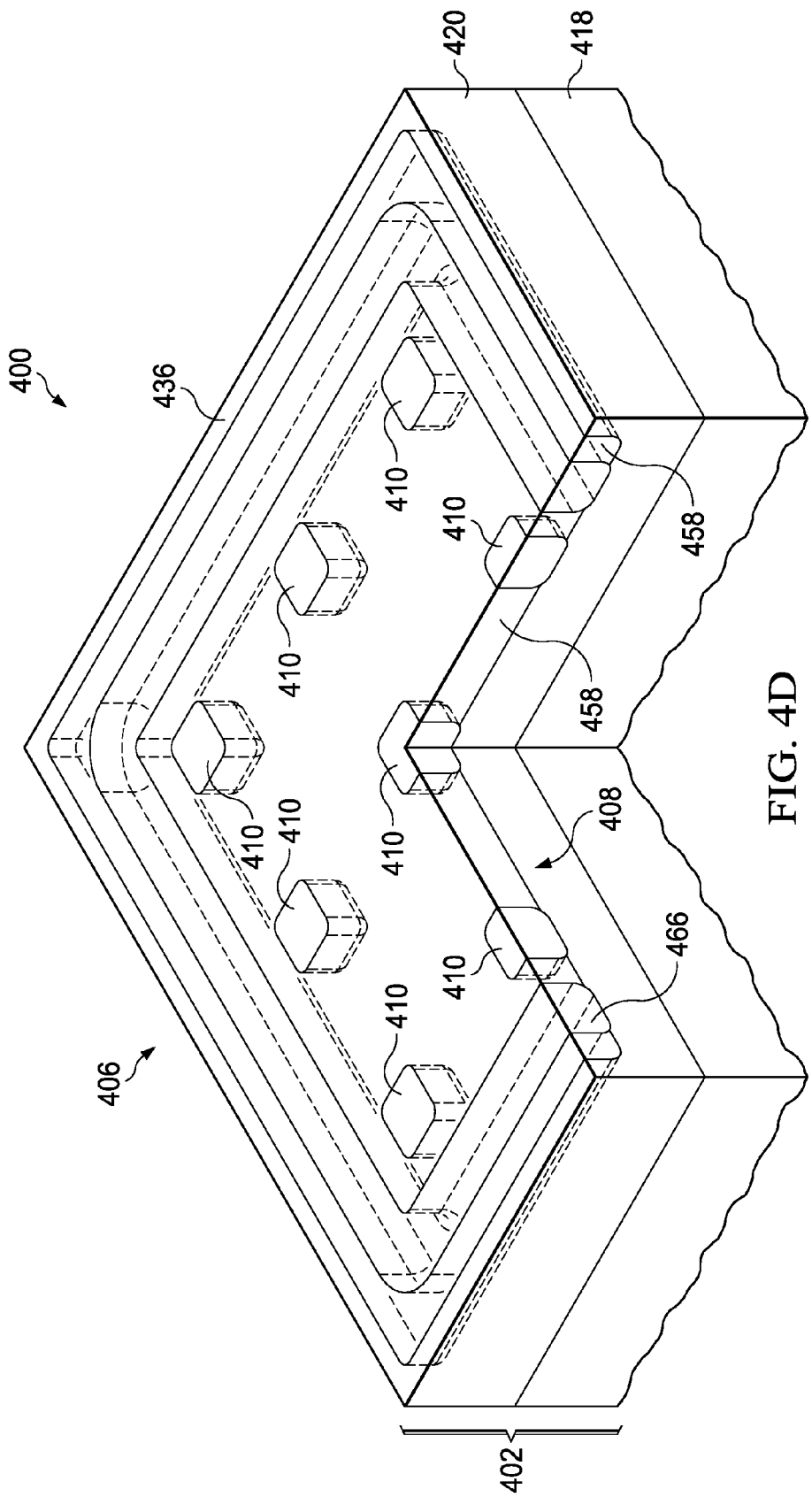

Referring to FIG. 4D, the epitaxial layer 420 under the upper region 458 provides a buried collection region 408 of the photodiode 406. An anneal operation causes the n-type dopants in the cathode implanted regions 460 of FIG. 4C to diffuse and become activated to form an n-type cathode 410 of the photodiode 406. The cathode 410 contacts and makes electrical connection to the buried collection region 408. If the guard ring implanted region 462 is present, the anneal operation causes the n-type dopants in the guard ring implanted region 462 to diffuse and become activated to form an n-type guard ring 466 around the cathode 410. The guard ring 466 may be disposed in the upper region 458 as depicted in FIG. 4D or outside the upper region 458. Cathode terminals are subsequently formed on the cathode 410 to provide electrical connection to a detection circuit.

Forming the photodiode 406 with the epitaxial layer 420 may advantageously facilitate integration of the photodiode 406 with analog components built on single epitaxial layers.

Forming the cathode 410 to occupy less lateral area than the photodiode 406 may advantageously provide a lower junction capacitance, and hence enable a higher operating frequency, compared to a photodiode with a larger area cathode.

Figure 5A:
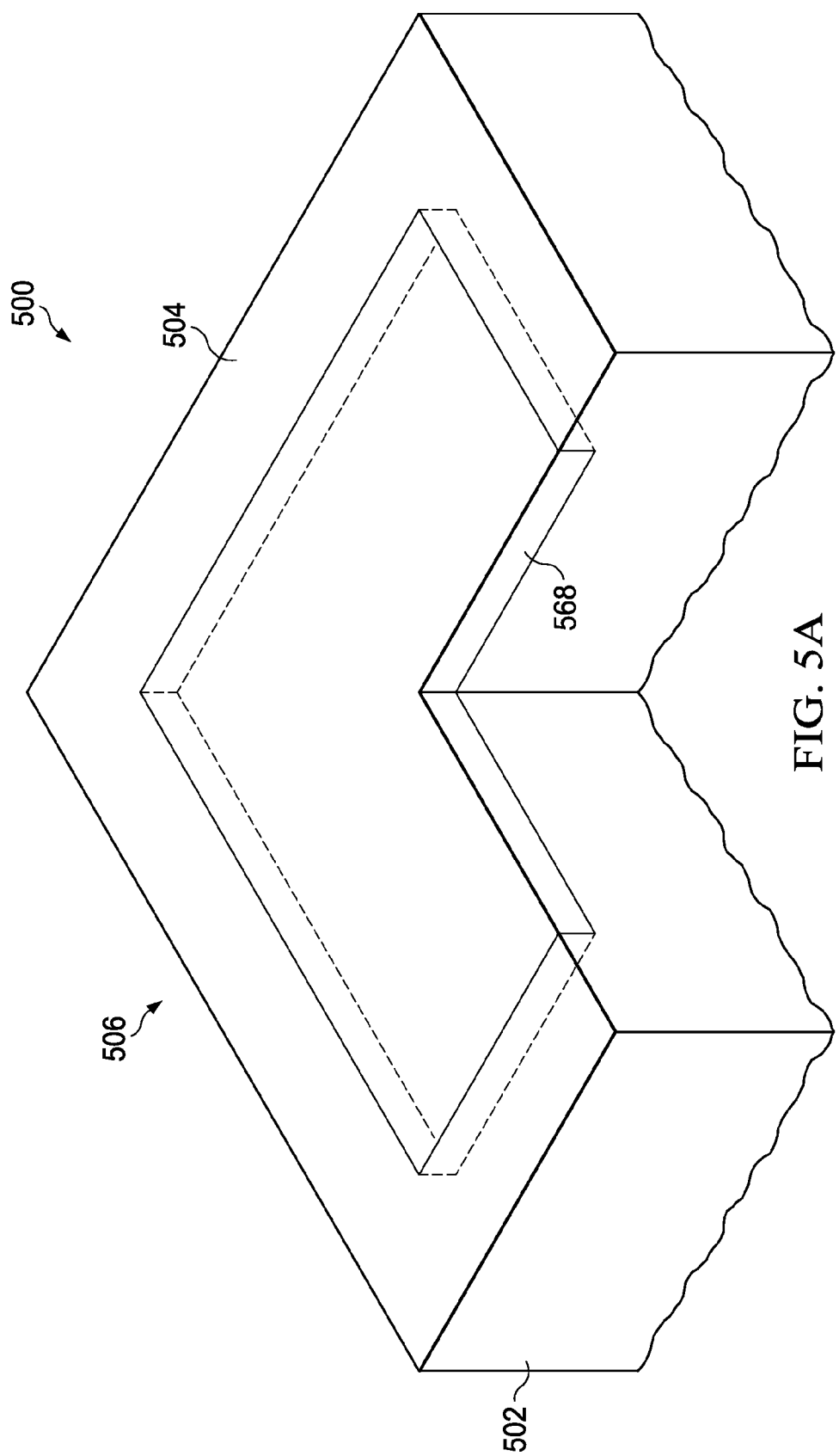
FIG. 5A through FIG. 5E are cross sections of a further semiconductor device containing a photodiode with a buried collection region, depicted in successive stages of fabrication.

FIG. 5A through FIG. 5E are cross sections of a further semiconductor device containing a photodiode with a buried collection region, depicted in successive stages of fabrication. Referring to FIG. 5A, the semiconductor device 500 is formed in and on a substrate 502 which includes a p-type semiconductor region with substantially uniform doping from a top surface 104 of the substrate 102 to a depth of at least 5 microns to 30 microns.

A deep counterdoping implanted layer 568 containing n-type dopants is formed in the substrate 502 in an area for the photodiode 506. The deep counterdoping implanted layer 568 may be formed by implanting n-type dopants such as phosphorus using an implant mask of photoresist or silicon dioxide. A dose of the n-type dopants used to form the deep counterdoping implanted layer 568 is selected to counterdope the substrate 502 in a subsequently formed deep counterdoped region without converting the deep counterdoped region to n-type.

Figure 5B:
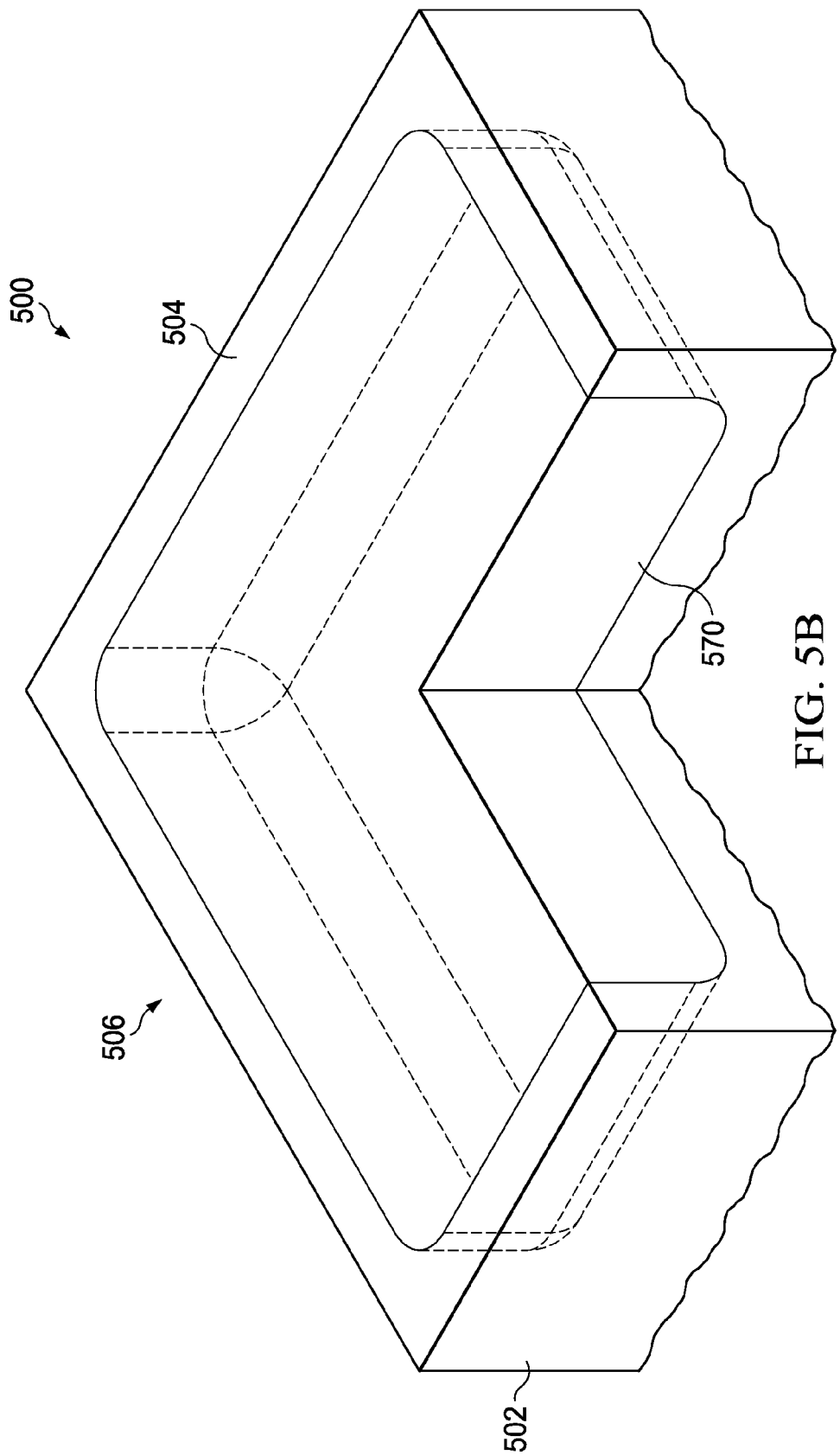

Referring to FIG. 5B, a thermal drive operation heats the substrate 502 causing the n-type dopants in the deep counterdoping implanted layer 568 of FIG. 5A to diffuse and become activated to form a deep counterdoped region 570 extending 5 to 30 microns into the substrate 502. A net average doping density of the deep counterdoped region 570 is at least a factor of ten lower than a net average doping density of the substrate 502 below the deep counterdoped region 570 and within 100 microns of the deep counterdoped region 570. In one version of the instant example, in which an average doping density in the substrate 502 is $3 \times 10^{16}$ cm$^{-3}$, and a depth of the subsequently formed deep counterdoped region is 10 microns, a dose of the n-type dopants used to form the deep counterdoping implanted layer 568 may be $3 \times 10^{13}$ cm$^{-2}$.

Figure 5C:
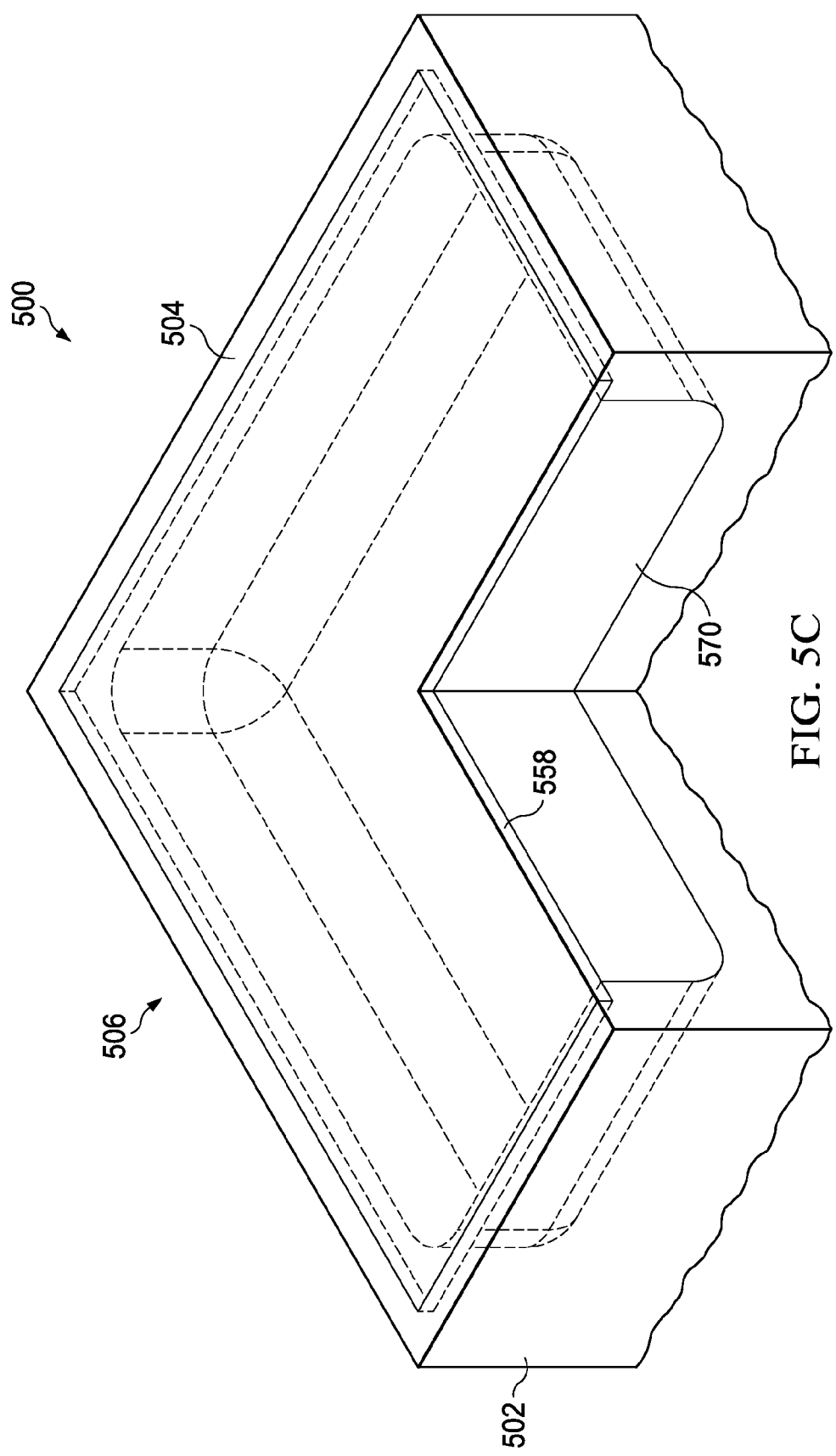

Referring to FIG. 5C, an upper region implanted layer 556 containing p-type dopants is formed at the top surface 504 of the substrate 502 over the deep counterdoped region 570. The upper region implanted layer 556 may overlap edges of the deep counterdoped region 570 as depicted in FIG. 5C. The upper region implanted layer 556 may be formed for example by using an implant mask of photoresist and implanting p-type dopants such as boron at a dose of $3 \times 10^{12}$ cm$^{-2}$ to $2 \times 10^{14}$ cm$^{-2}$. Following the version of the instant example described in reference to FIG. 5A, a dose of the p-type dopants in the upper region implanted layer 556 may be $3 \times 10^{13}$ cm$^{-2}$.

Figure 5D:
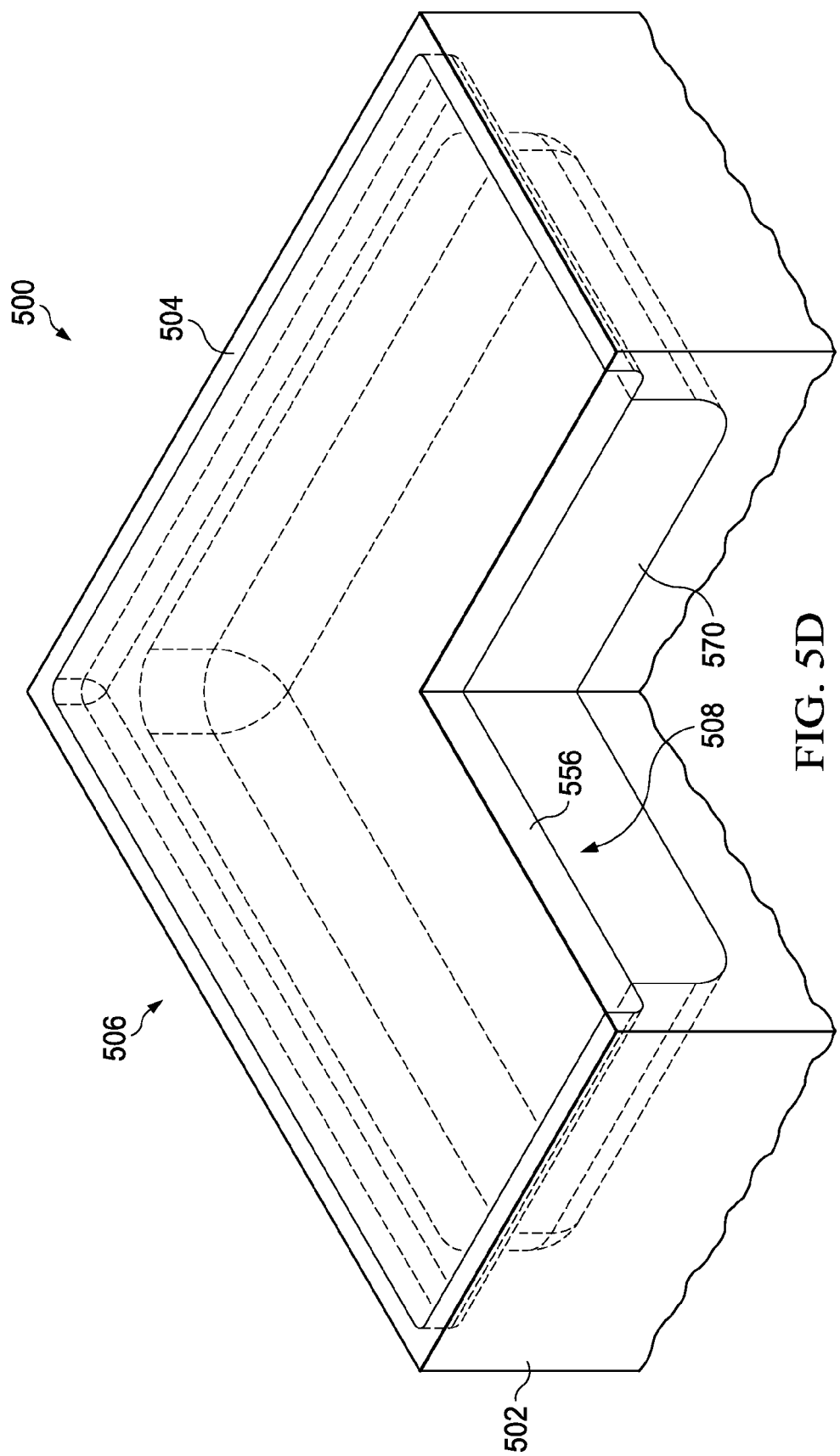

Referring to FIG. 5D, a thermal drive operation heats the substrate 502 causing the p-type dopants in the upper region implanted layer 556 of FIG. 5C to diffuse and become activated to form a p-type upper region 558 in the area for the photodiode 506. A net average doping density of the upper region 558 is at least a factor of ten higher than a net average doping density of the deep counterdoped region 570 below the upper region 558. The deep counterdoped region 570 below the upper region 558 provides a buried collection region 508 of the photodiode 506.

Figure 5E:
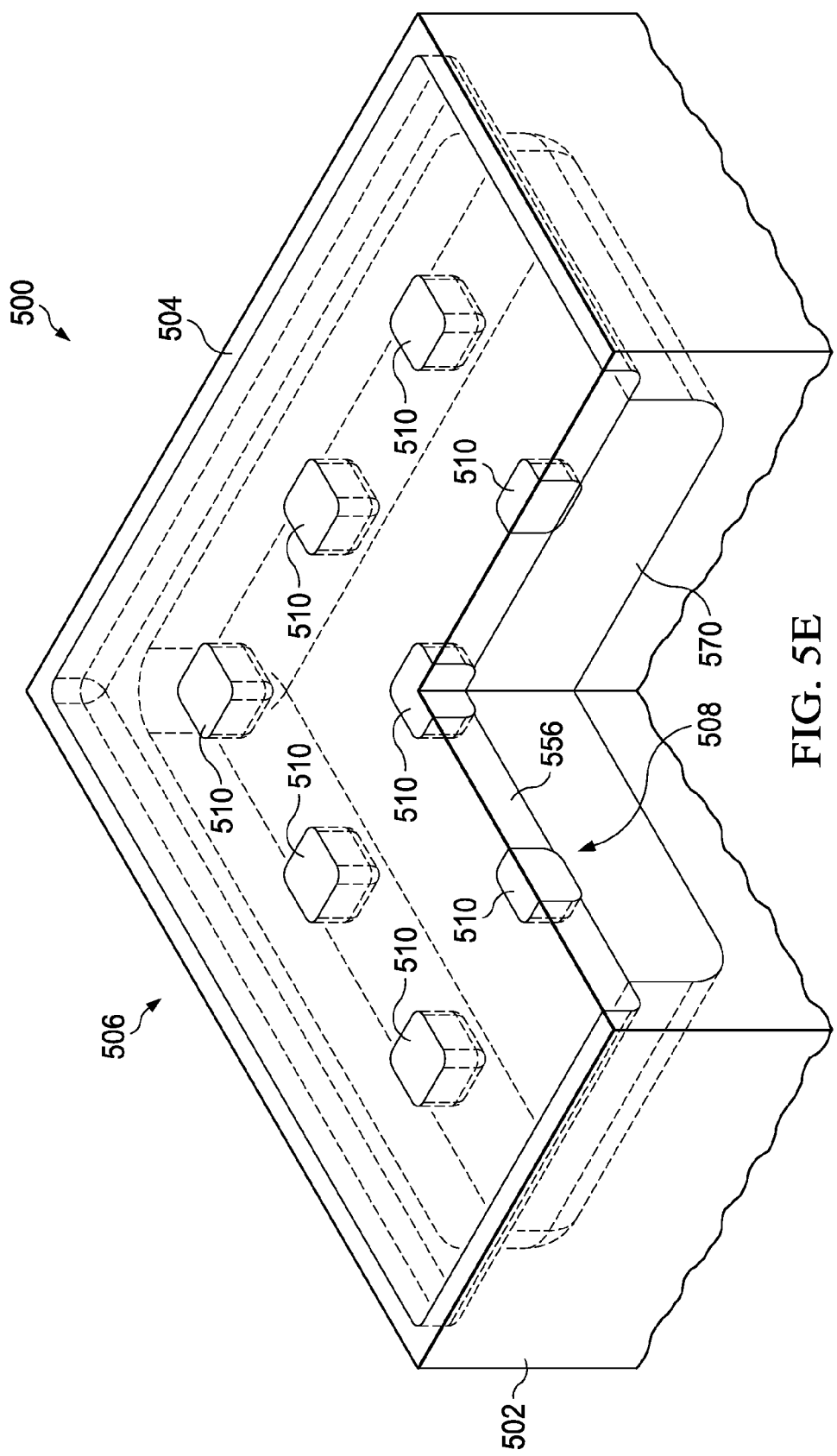

Referring to FIG. 5E, an n-type cathode 510 of the photodiode 506 is formed in the substrate 502 extending from the top surface 504 of the substrate 502 to the deep counterdoped region 570 below the upper region 558. The cathode 510, which makes electrical connection to the deep counterdoped region 570, may have a plurality of separate n-type diffused regions as depicted in FIG. 5E, so as to reduce a capacitance of a subsequently formed cathode of the photodiode 506. Alternatively, the cathode 510 may have another configuration, for example an array of n-type linear diffused regions or a frame at a boundary of the photodiode 506 to improve a collection efficiency of the photodiode 506. The cathode 510 may be formed, for example, by implanting n-type dopants such as phosphorus and possibly arsenic using an implant mask, followed by an appropriate anneal.

A guard ring may optionally be formed around the photodiode 506, however, forming the buried collection region 508 to be laterally limited by a boundary of the deep counterdoped region 570 advantageously limits a collection area of the photodiode 506 and hence may render a guard ring unnecessary. Forming the buried collection region 508 using the deep counterdoped region 570 in a substantially uniformly doped substrate 502 may advantageously facilitate integration of the photodiode 506 with analog components built in homogeneous substrates. Forming the cathode 510 to occupy less lateral area than the photodiode 506 may advantageously provide a lower junction capacitance, and hence enable a higher operating frequency, compared to a photodiode with a larger area cathode.

Figure 6A:
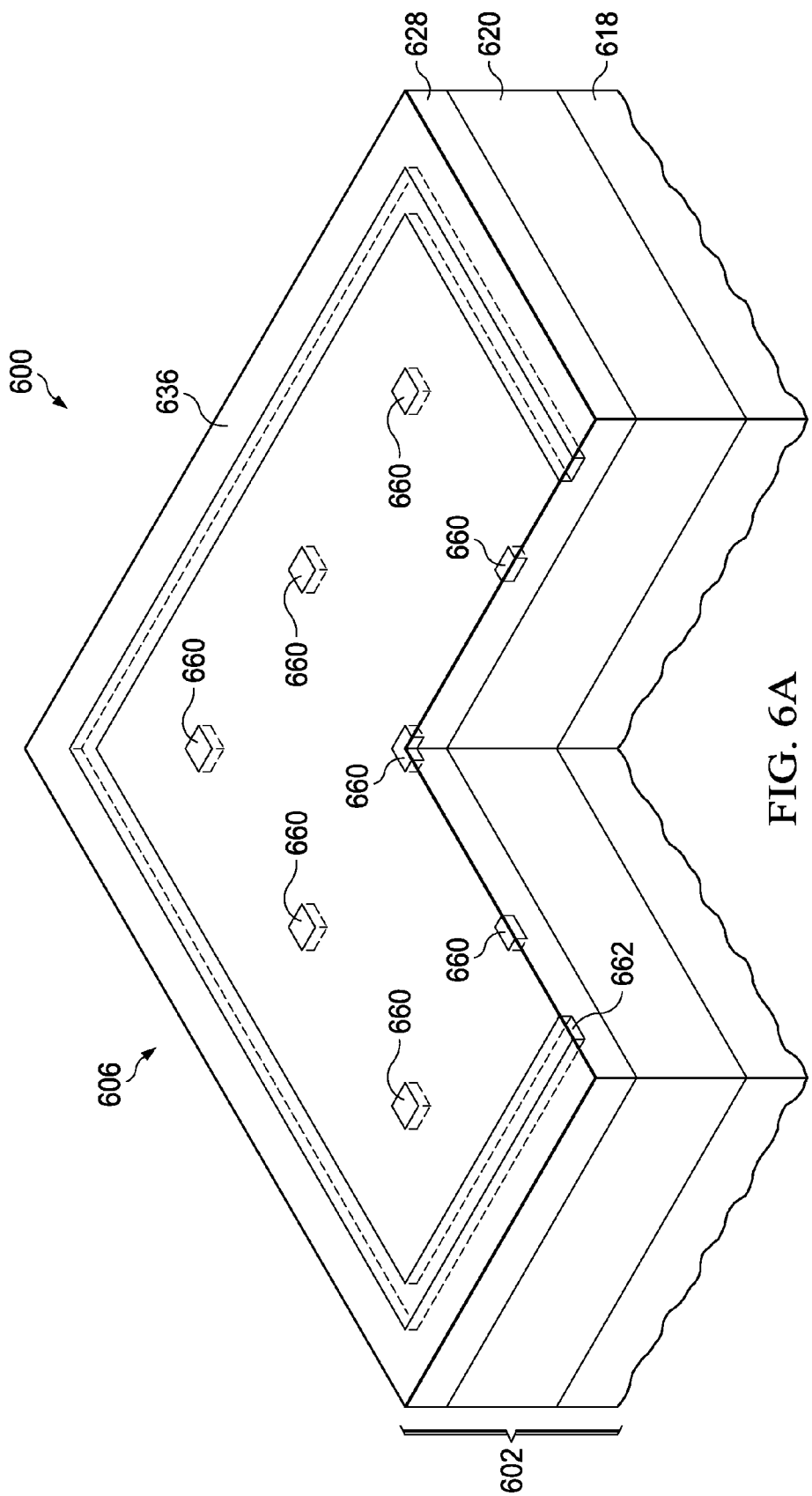
FIG. 6A and FIG. 6B are cross sections of another semiconductor device containing a photodiode with a buried collection region, depicted in successive stages of fabrication.
Figure 6B:
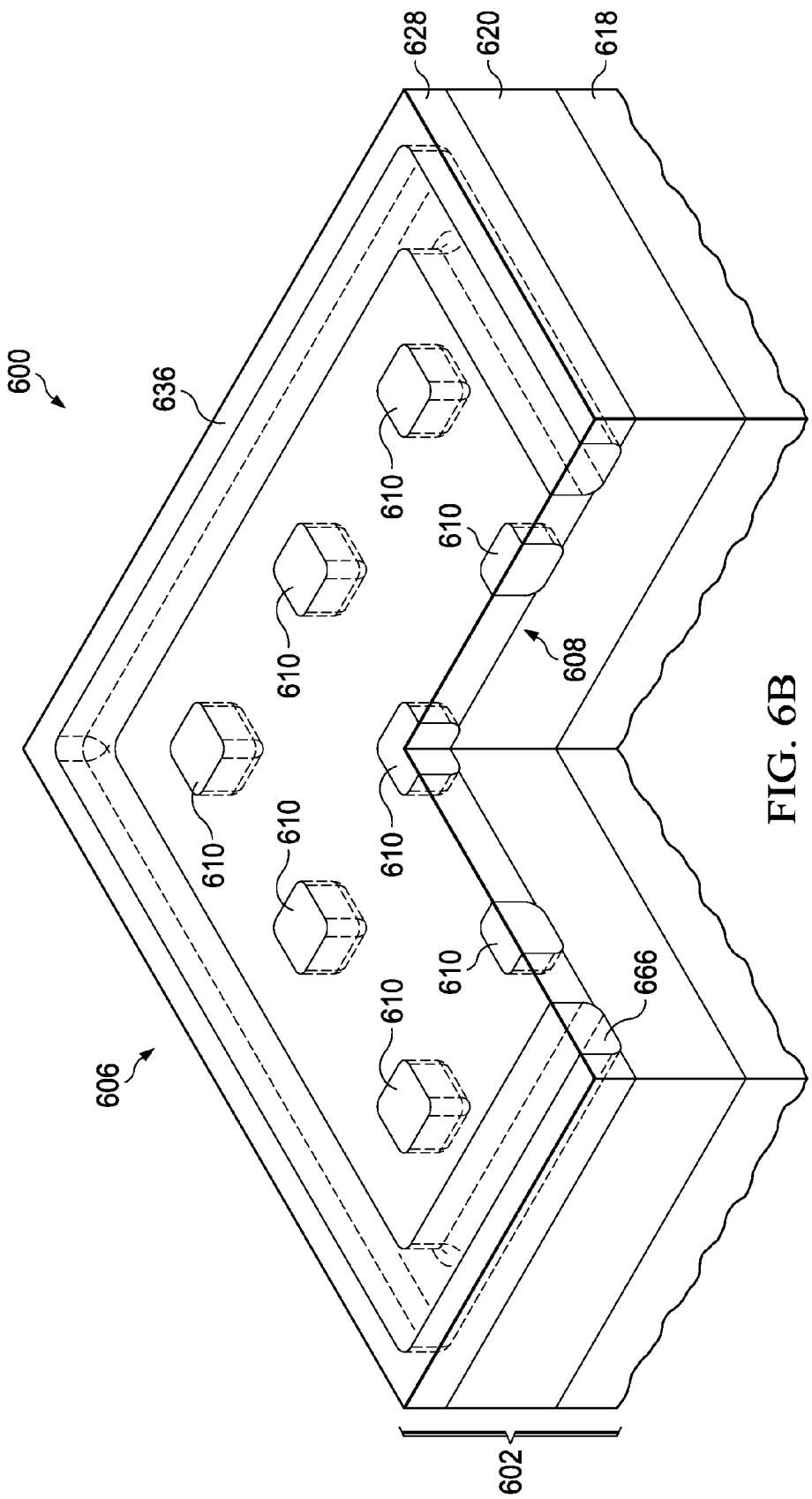

FIG. 6A and FIG. 6B are cross sections of another semiconductor device containing a photodiode with a buried collection region, depicted in successive stages of fabrication. Referring to FIG. 6A, the semiconductor device 600 is formed in and on a substrate 602 which includes a p-type starting wafer 618, a p-type lower epitaxial layer 620 formed over the starting wafer 618, and a p-type upper epitaxial layer 628 formed over the lower epitaxial layer 620. A net average doping density of the starting wafer 618 within 100 microns of the lower epitaxial layer 620 is at least a factor of ten higher than a net average doping density of the lower epitaxial layer 620. The lower epitaxial layer 620 may be, for example, 2 microns to 30 microns thick. A net average doping density of the upper epitaxial layer 628 is at least a factor of ten higher than a net average doping density of the lower epitaxial layer 620. The upper epitaxial layer 628 may be, for example, 2 microns to 5 microns thick.

Cathode implanted regions 660 containing n-type dopants are formed in the upper epitaxial layer 628 at the top surface 636 of the upper epitaxial layer 628. The cathode implanted regions 660 may be formed for example by implanting n-type dopants such as phosphorus using an implant mask of photoresist at a dose of $3 \times 10^{15}$ cm$^{-2}$ to $2 \times 10^{16}$ cm$^{-2}$. In one version of the instant example, the cathode implanted regions 660 may have lateral dimensions less than 2 microns and be separated by more than 10 microns, so as to reduce a capacitance of a subsequently formed cathode of the photodiode 606. In other versions, the cathode implanted regions 660 may be configured as an array of lines or a frame at a boundary of the photodiode 606 to improve a collection efficiency of the photodiode 606. Optionally, a guard ring implanted region 662 may be formed around the area for the photodiode 606 concurrently with the cathode implanted regions 660. The lower epitaxial layer 620 under the cathode implanted regions 660 provides a buried collection region 608 of the photodiode 606.

Referring to FIG. 6B, an anneal operation causes the n-type dopants in the cathode implanted regions 660 of FIG. 6A to diffuse and become activated to form an n-type cathode 610 of the photodiode 606. The cathode 610 contacts and makes electrical connection to the buried collection region 608. If the guard ring implanted region 662 is present, the anneal operation causes the n-type dopants in the guard ring implanted region 662 to diffuse and become activated to form an n-type guard ring 666 around the cathode 610. Cathode terminals are subsequently formed on the cathode 610 to provide electrical connection to a detection circuit.

Forming the photodiode 606 with the cathode 610 free of buried elements may advantageously facilitate integration of the photodiode 406 with analog components built on double epitaxial substrates which do not include buried elements in the fabrication sequence. Forming the cathode 610 to occupy less lateral area than the photodiode 606 may advantageously provide a lower junction capacitance, and hence enable a higher operating frequency, compared to a photodiode with a larger area cathode.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
    a substrate comprising a semiconductor having a first conductivity type;
    a photodiode, comprising:
        a buried collection region formed by a bandgap well, said buried collection region being disposed in said substrate; said buried collection region having said first conductivity type, said buried collection region having a net average doping density at least a factor of ten less than a net average doping density of a region in said substrate above and contacting said buried collection region and at least a factor of ten less than a net average doping density of said substrate below said buried collection region within 100 microns of said buried collection region; and
        a cathode having a second conductivity type opposite from said first conductivity type, said cathode extending from a top surface of said substrate to said buried collection region, making electrical connection to said buried collection region, so that a lateral area of said cathode is less than a lateral area of said buried collection region.

2. The semiconductor device of claim 1, in which said buried collection region is disposed at a depth of 2 microns to 5 microns below a top surface of said substrate, and said buried collection region has a thickness of 2 microns to 30 microns.

3. The semiconductor device of claim 1, in which said lateral area of cathode is less than half of said lateral area of said buried collection region.

4. The semiconductor device of claim 1, in which said cathode surrounds said buried collection region.

5. The semiconductor device of claim 1, in which said cathode comprises a plurality of separate diffused regions.

6. The semiconductor device of claim 1, in which said semiconductor device comprises a guard ring surrounding said cathode.

7. The semiconductor device of claim 1, in which said buried collection region is disposed in a lower epitaxial layer and an upper epitaxial layer is disposed over said buried collection region.

8. The semiconductor device of claim 1, in which said buried collection region is disposed in an epitaxial layer and an upper region is disposed over said buried collection region, said upper region comprising diffused dopants of said first conductivity type.

9. The semiconductor device of claim 1, in which said buried collection region is disposed in a deep counterdoped region and an upper region is disposed over said buried collection region, said deep counterdoped region comprising diffused dopants of said second conductivity type, and said upper region comprising diffused dopants of said first conductivity type.

10. The semiconductor device of claim 1, in which said first conductivity type is p-type and said second conductivity type is n-type.

11. A method of forming a semiconductor device, comprising the steps of:
    providing a substrate comprising a semiconductor having a first conductivity type;
    forming a photodiode, by a process comprising the steps of:
        forming a buried collection region in said substrate; said buried collection region having said first conductivity type, so that said buried collection region has a net average doping density at least a factor of ten less than a net average doping density of said substrate above and contacting said buried collection region and at least a factor of ten less than a net average doping density of said substrate below said buried collection region within 100 microns of said buried collection region, so that said buried collection region is formed by a bandgap well; and
        forming a cathode having a second conductivity type opposite from said first conductivity type, said cathode extending from a top surface of said substrate to said buried collection region, so as to make electrical connection to said buried collection region, so that a lateral area of said cathode is less than a lateral area of said buried collection region.

12. The method of claim 11, in which said buried collection region is formed at a depth of 2 microns to 5 microns below a top surface of said substrate, and said buried collection region is formed to have a thickness of 2 microns to 30 microns.

13. The method of claim 11, in which said buried collection region and said cathode are formed so that said lateral area of cathode is less than half of said lateral area of said buried collection region.

14. The method of claim 11, in which said cathode is formed to surround said buried collection region.

15. The method of claim 11, in which said cathode formed to comprise a plurality of separate diffused regions.

16. The method of claim 11, further comprising the step of forming a guard ring surrounding said cathode.

17. The method of claim 11, in which:
    said substrate includes a base region, and a lower epitaxial layer of said first conductivity type over said base region, said lower epitaxial layer having a net average doping density at least a factor of ten less than a net average doping density of said starting wafer within 100 microns of said lower epitaxial layer;
    said step of forming said buried collector region includes the step of forming an upper epitaxial layer over said lower epitaxial layer, said upper epitaxial layer having a net average doping density at least a factor of ten higher than a net average doping density of said lower epitaxial layer, so that said lower epitaxial layer proximate to said buried cathode provides said buried collector region of said photodiode; and
    said step of forming said cathode includes the steps of:
        implanting dopants of said second conductivity type in said lower epitaxial layer to form a cathode implanted region at a top surface of said lower epitaxial layer;

heating said substrate in a thermal drive operation so as to diffuse said dopants of said cathode implanted region, so that during said step of forming said upper epitaxial layer, said dopants of said cathode implanted region diffuse and become activated to form a buried cathode; and forming cathode connector regions of said second conductivity type in said upper epitaxial layer, so that said cathode connector regions contact and make electrical connection to said buried cathode, so that said buried cathode combined with said cathode connector regions provides said cathode of said photodiode.

18. The method of claim 11, in which:

said substrate includes a base region, and an epitaxial layer of said first conductivity type over said base region, said epitaxial layer having a net average doping density at least a factor of ten less than a net average doping density of said starting wafer within 100 microns of said epitaxial layer;

said step of forming said buried collection region includes the steps of:

implanting dopants of said first conductivity type in said epitaxial layer to form an upper region implanted layer at a top surface of said epitaxial layer; and heating said substrate in a thermal drive operation so as to diffuse said dopants of said upper region implanted region to form an upper region having said first conductivity type, so that a net average doping density of said upper region is at least a factor of ten higher than a net average doping density of said epitaxial layer below said upper region, so that said epitaxial layer below said upper region provides said buried collection region of said photodiode; and said step of forming said cathode is performed so that said cathode is disposed in said upper region and extends to and contacts said deep counterdoped region below said upper region.

19. The method of claim 11, in which:

said step of forming said buried collection region includes the steps of:

implanting dopants of said second conductivity type in said substrate and subsequently heating said substrate so that said implanted dopants diffuse become activated to form a deep counterdoped region having said first conductivity type, extending 5 microns to 30 microns into said substrate from said top surface of said substrate, so that a net average doping density of said deep counterdoped region is at least a factor of ten lower than a net average doping density of said substrate below said deep counterdoped region and within 100 microns of said deep counterdoped region;

implanting dopants of said first conductivity type in said deep counterdoped region to form an upper region implanted layer at a top surface of said deep counterdoped region; and heating said substrate in a thermal drive operation so as to diffuse said dopants of said upper region implanted region to form an upper region having said first conductivity type, so that a net average doping density of said upper region is at least a factor of ten higher than a net average doping density of said deep counterdoped region below said upper region, so that said deep counterdoped region below said upper region provides said buried collection region of said photodiode; and said step of forming said cathode is performed so that said cathode is disposed in said upper region and extends to and contacts said deep counterdoped region below said upper region.

20. The method of claim 11, in which said first conductivity type is p-type and said second conductivity type is n-type.

* * * * *